United States Patent
Sinha et al.

(10) Patent No.: US 9,875,790 B1
(45) Date of Patent: Jan. 23, 2018

(54) BOOST CHARGE RECYCLE FOR LOW-POWER MEMORY

(71) Applicant: QUALCOMM Incorporated, San Diego, CA (US)

(72) Inventors: Rakesh Kumar Sinha, Bangalore (IN); Priyankar Mathuria, Bangalore (IN); Sharad Kumar Gupta, Bangalore (IN); Lakshmikantha Holla Vakwadi, Bangalore (IN)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/476,746

(22) Filed: Mar. 31, 2017

(51) Int. Cl.
  *G11C 11/00* (2006.01)
  *G11C 11/419* (2006.01)
  *G11C 11/417* (2006.01)

(52) U.S. Cl.
  CPC .......... *G11C 11/419* (2013.01); *G11C 11/417* (2013.01)

(58) Field of Classification Search
  CPC ............................. G11C 11/417; G11C 11/419

USPC ............................................ 365/154, 189.16
See application file for complete search history.

(56) References Cited

U.S. PATENT DOCUMENTS

| 8,233,342 | B2 | 7/2012 | Adams et al. |
| 8,363,453 | B2* | 1/2013 | Arsovski ................. G11C 7/12 365/154 |
| 8,411,518 | B2* | 4/2013 | Janardan ................. G11C 7/04 365/194 |
| 8,593,890 | B2* | 11/2013 | Adams ................. G11C 11/419 365/154 |
| 8,861,290 | B2* | 10/2014 | Zimmer ................. G11C 7/12 365/189.16 |
| 9,324,392 | B1 | 4/2016 | Asenov et al. |
| 9,437,281 | B2 | 9/2016 | Hsieh et al. |
| 9,455,028 | B1* | 9/2016 | Sahu ................. G11C 7/12 |
| 9,460,776 | B2 | 10/2016 | Dally et al. |
| 9,496,025 | B2* | 11/2016 | Chandra ................. G11C 11/419 |

\* cited by examiner

*Primary Examiner* — Son Mai

(74) *Attorney, Agent, or Firm* — Haynes and Boone, LLP

(57) ABSTRACT

A negative bit line boost circuit for a memory is configured to control a write multiplexer and a write assist transistor so that charge from a boost capacitor positively charges a bit line following a write assist period.

17 Claims, 5 Drawing Sheets

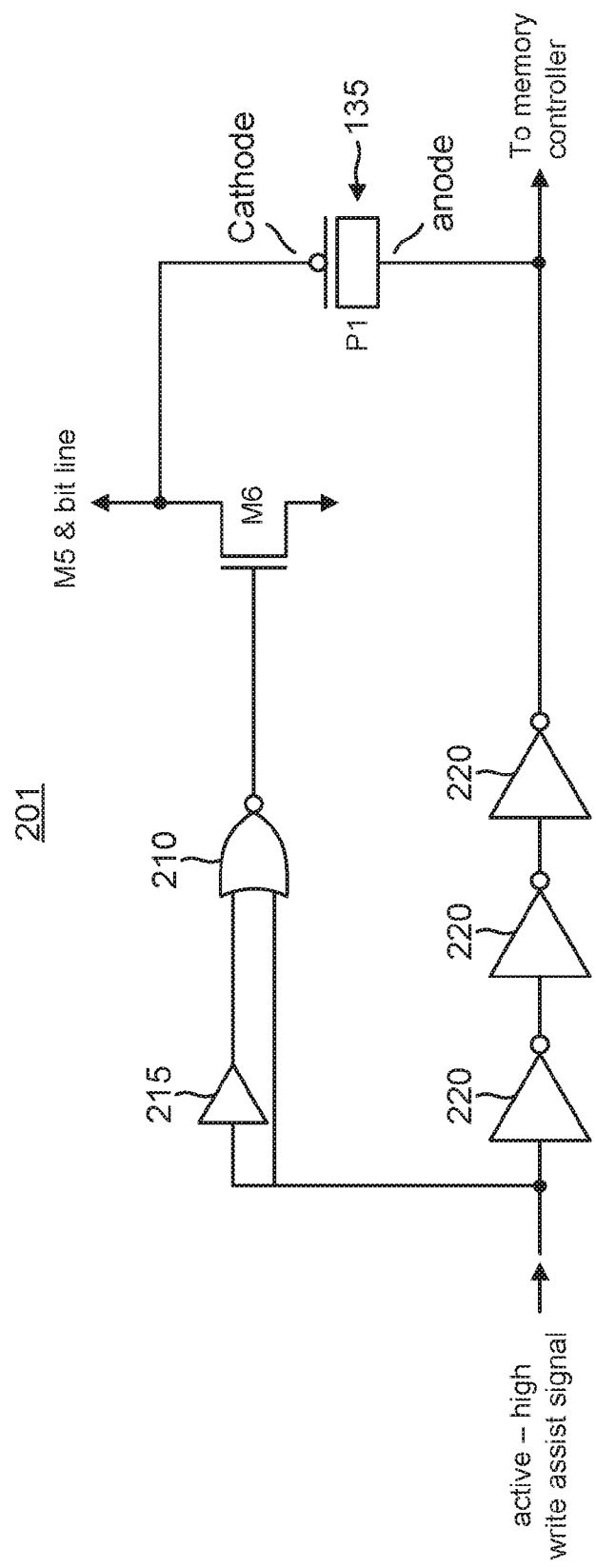

BOOST CHARGE RECYCLE FOR LOW-POWER MEMORY

TECHNICAL FIELD

This application relates to memories, and more particularly to a memory having a negative bit line write assist with boost charge recycling.

BACKGROUND

A static random access memory (SRAM) bitcell includes a pair of cross-coupled inverters. Depending upon the binary state of a stored data bit, a p-type metal oxide semiconductor (PMOS) transistor in one of the inverters may charge a true (Q) data node. Similarly, a PMOS transistor in a remaining one of the cross-coupled inverters may charge a complement (QB) data node depending the binary state of the stored data bit. The Q data node couples through a first n-type metal oxide semiconductor (NMOS) access transistor to a bit line whereas the QB data node couples through a second NMOS access transistor to a complement bit line. During a write operation in which the binary content of the bitcell is changed, one of the PMOS transistors will initially be on and charging its data node while the corresponding access transistor is attempting to discharge the same data node through the corresponding grounded bit or complement bit line. The NMOS access transistor must thus be relatively strong with regard to the PMOS transistor so that the data node can be discharged relatively quickly. To provide this strength, the NMOS access transistors may be relatively large as compared to the inverter PMOS transistors. But increasing the size of the NMOS access transistors reduces density for the resulting SRAM.

To strengthen the NMOS access transistor without such a loss in density, it is thus conventional to provide a negative boost voltage on the otherwise-grounded bit line during the write operation. This negative boost voltage applied during a write assist period increases the strength of the NMOS access transistor in comparison to the inverter PMOS transistor so that the NMOS access transistor can quickly discharge the corresponding data node yet each NMOS access transistor may remain relatively small to enhance density. The negative boost voltage is applied during the write assist period by coupling the appropriate bit line to a charged boost capacitor. But the charge on the boost capacitor is partially discharged to ground at the termination of the write assist period.

This discharge of the boost capacitor charge may be better appreciated with regard to a conventional memory 100 shown in FIG. 1. For illustration clarity, only a single bit line 105 and a memory cell (bit cell) 110 are illustrated in memory 100. Memory cell 110 includes a pair of cross-coupled inverters 115 each having a PMOS transistor (not illustrated) as discussed previously. When a voltage for a word line 120 is asserted high, a Q data node for memory cell 110 couples to bit line 105 through an NMOS access transistor M1. The binary state of bit line 105 depends upon a data signal (DATA) from a write driver (not illustrated) that drive a gate of an NMOS data transistor M5. The drain of data transistor M5 couples to the bit line through a bit line multiplexer 125. Using bit line multiplexer 125, the write driver may write to a plurality of other bit lines (not illustrated) in addition to bit line 105 depending upon the binary state of a write multiplexer control signal that drives a gate of a plurality of NMOS write multiplexer transistors within write multiplexer 125. For example, a write multi- plexer transistor M2 couples between the drain of data transistor M5 and bit line 105. Similarly, a write multiplexer transistor M3, a write multiplexer transistor M4, and a write multiplexer transistor M7 all couple between the drain of data transistor M5 and their respective bit lines (not illustrated).

The source of data transistor M5 couples to ground through an NMOS write assist transistor M6. A write assist (negative bit line boost) signal that drives the gate of write assist transistor M6 has a default high state that is pulsed low during the write assist period. Prior to the write assist period, write assist transistor M6 will thus be on such that if the data signal is high, bit line 105 is discharged to ground. The default high state of the write assist signal also passes through a buffer 130 to charge a boost capacitor 135 formed by the gate capacitance of a PMOS transistor P1. The gate of transistor P1 couples to the source of data transistor M5 whereas its drain and source are both coupled to the output of buffer 130. The drain and source of transistor P1 (the anode of boost capacitor 135) will thus be charged high by the buffer output signal as the gate for PMOS transistor P1 is discharged to ground. This discharge of the gate for PMOS transistor P1 occurs through the drain of write assist transistor M6 prior to the write assist period during a write operation in which the data signal is in a binary one state. When the write assist signal goes low, the cathode of boost capacitor 135 (the gate of transistor P1) will thus be pulled below ground due to the gate capacitance for transistor P1. This negative boost for bit line 105 strengthens access transistor M1 compared to the PMOS transistor charging data node Q so that the write operation speed is increased.

The falling edge of the write assist signal is delayed by buffer 130 so that write assist transistor M6 may first be turned off to cause bit line 105 to float so that it may be subsequently pulled to a negative voltage by boost capacitor 135 during the write assist period. Prior to the end of the write assist period, write multiplexer transistor M2 is switched off to isolate bit line 105. Following the rising edge of the write assist signal (i.e., the termination of the write assist period), some of the charge for boost capacitor 135 is then discharged to ground through the switching on of write assist transistor M6. During each write operation, boost capacitor 135 thus discharges an appreciable amount of charge to ground.

Accordingly, there is a need in the art for memories having a negative bit line boost with reduced power consumption.

SUMMARY

A memory is provided in which a boost capacitor charges a bit line to a negative voltage during a write assist period. The assertion of a write assist signal defines the write assist period. Prior to the beginning of the write assist period, a write multiplexer transistor is switched on to couple the bit line to a data transistor having its gate driven by a data signal. The data transistor couples to ground through a write assist transistor. Prior to the write assist period, the write multiplexer transistor, the data transistor, and the write assist transistor are initially all on so that the bit line discharges to ground. The write assist transistor is then switched off responsive to the assertion of write assist signal to float the bit line so that the write assist period can begin, whereupon the bit line is given the negative voltage from the boost capacitor.

To couple the bit line to the data transistor prior to the write assist period, a memory controller asserts a write multiplexer signal. Note that as used herein, a signal is said to be "asserted" regardless of whether that assertion is active-high or active-low. The default (non-asserted) state of the write assist signal maintains the write assist transistor on outside of the write assist period. To apply the negative boost, a cathode of a boost capacitor couples to a source terminal of the data transistor. The boost capacitor cathode will thus be grounded when the bit line is grounded prior to the write assist period. An anode of the boost capacitor is positively charged responsive to the default state of the write assist signal while the boost capacitor cathode is grounded. At the assertion of the write assist signal, the write assist transistor switches off to isolate the grounded bit line. The asserted write signal is delayed through a delay circuit to produce a delayed asserted write signal that grounds the boost capacitor anode. Since the boost capacitor cathode was negatively charged with regard to the boost capacitor anode, this grounding of the boost capacitor anode negative charges the boost capacitor cathode that in turn provides a negative voltage boost to the bit line through the switched-on data transistor.

The memory controller is configured to maintain the assertion of the write multiplexer signal such that the write multiplexer signal is still asserted when the write assist signal is de-asserted at the end of the write assist period. This de-assertion of the write assist signal is delayed through the delay circuit but will cause the anode of the boost capacitor to again be positively charged. This increase of the boost capacitor anode voltage causes the boost capacitor cathode voltage to also be elevated slightly above ground. The bit line can thus be positively charged at the end of the write assist period such that the boost charge from the boost capacitor is effectively "recycled" so as to be used to positively charge the bit line. The memory thus saves charge with respect to a subsequent pre-charging of the bit line during to a subsequent write operation. To keep the write assist transistor off during this boost charge recycling, a logic circuit functions to process the write assist signal with a delayed version of the write assist signal to delay the switching on of the write assist transistor responsive to the de-assertion of the write assist signal at the conclusion of the write assist period. The write assist transistor is thus switched off at the assertion of the write assist signal but is not switched back on until a boost charge recycling period of delay has expired following the de-assertion of the write assist signal. In this fashion, the boost charge is advantageously recycled to positively charge the bit line prior to a subsequent pre-charging of the bit line.

These and other advantageous features may be better appreciated through the following detailed description.

BRIEF DESCRIPTION OF THE DRAWINGS

FIG. 2B illustrates an example logic circuit for the write assist circuit in the memory of FIG. 2A in accordance with an aspect of the disclosure.

Embodiments of the present invention and their advantages are best understood by referring to the detailed description that follows. It should be appreciated that like reference numerals are used to identify like elements illustrated in one or more of the figures.

DETAILED DESCRIPTION

A memory write assist circuit for a memory is provided that effectively recycles some of the charge from the boost capacitor that would otherwise be discharged to ground through the write assist transistor to positively charge the bit line following the write assist period. Since the charge is no longer discharged to ground, the resulting memory is advantageously low power yet also enjoys the density that negative bit line boost techniques provide with regard to maintaining the memory cell access transistors to be relatively small. Without a negative bit line boost, the access transistors would struggle to flip the memory cell contents such that memory operation speed suffers unless the access transistors were sized relatively large as compared to the PMOS transistors in the memory cells' cross-coupled inverters. But the memory write assist circuit disclosed herein enables use of relatively small access transistors yet provides low power consumption due to the prevention of the boost capacitor charge being discharged to ground through the write assist transistor following the termination of the write assist period. These advantageous properties may be better appreciated with reference to the following example embodiments.

Figure 1:
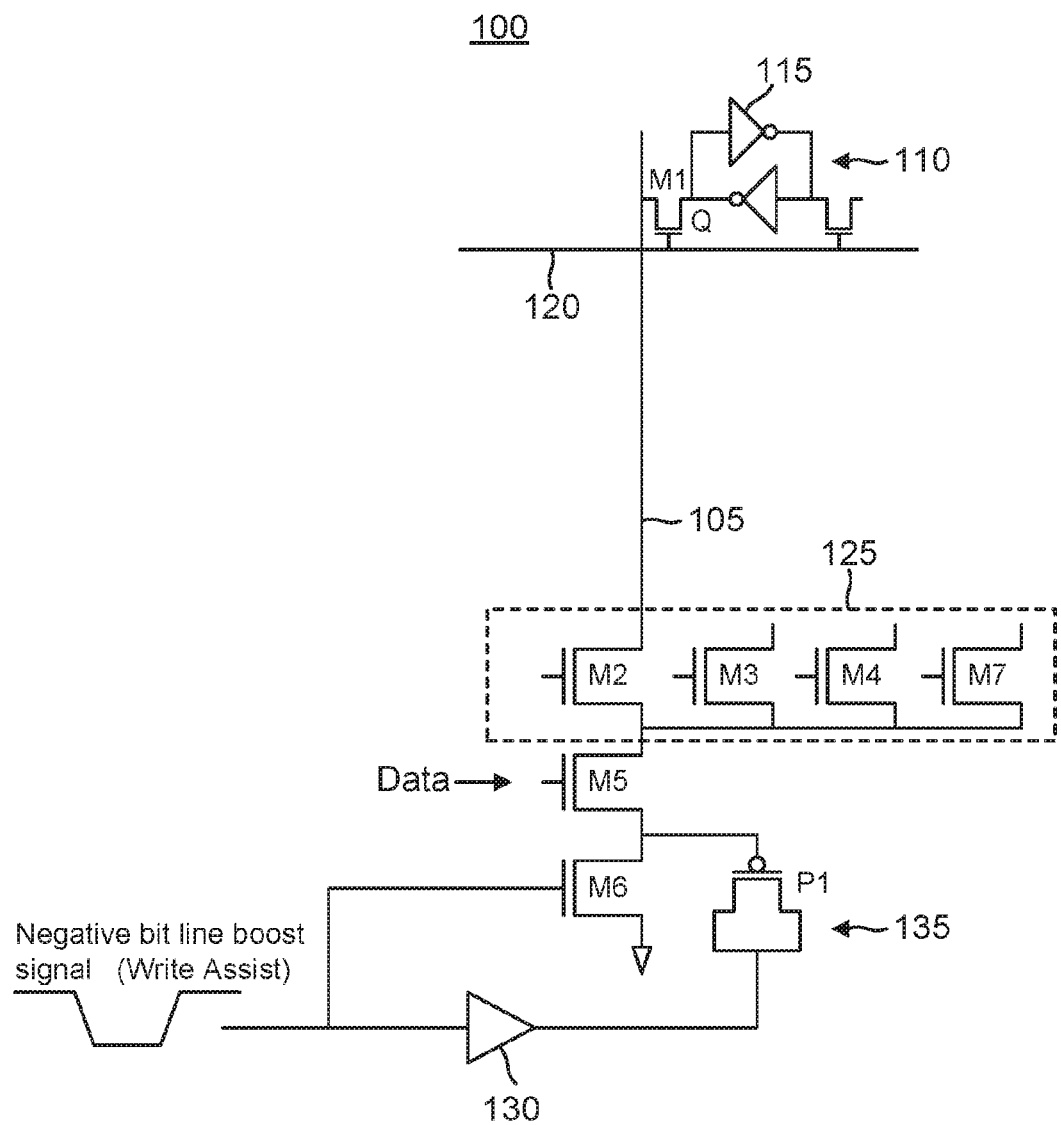
FIG. 1 is a circuit diagram of a conventional memory with negative bit line boost.
Figure 2A:
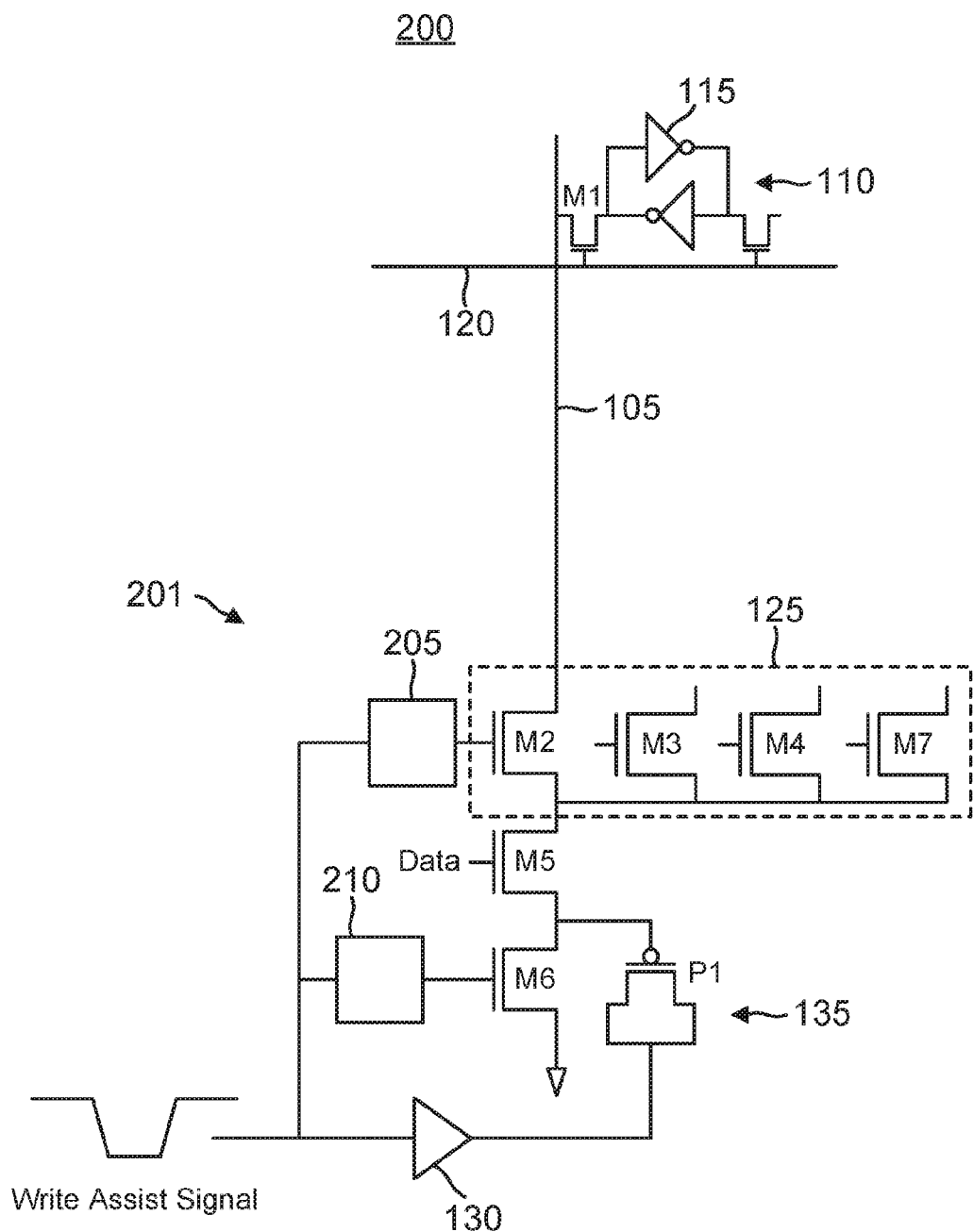
FIG. 2A is a circuit diagram of an example memory in which charge from the boost capacitor is utilized following the negative bit line boost to positively charge the bit line for reduced power consumption in accordance with an aspect of the disclosure.

An example memory 200 including a negative bit line boost circuit 201 is shown in FIG. 2A. As discussed with regard to memory 100, memory 200 includes memory cell 110 formed through a pair of cross-coupled inverters 115 each having a PMOS transistor (not illustrated). Memory 200 is thus a static random access memory (SRAM) although it will be appreciated that other types of memories may also benefit from the negative bit line boost techniques and circuits disclosed herein. For illustration clarity, only a single bit line 105 and memory cell (bit cell) 110 are illustrated in memory 200. As also discussed previously, when a voltage for word line 120 is asserted high during a write operation, a Q data node of memory cell 110 couples to bit line 105 through a switched-on NMOS access transistor M1. The binary state of bit line 105 depends upon a data signal (DATA) from a write driver (not illustrated) that drives a gate of an NMOS data transistor M5. The drain of data transistor M5 couples to bit line 105 through bit line multiplexer 125 as also discussed with regard to memory 100. In this fashion, the write driver may write to a plurality of other bit lines (not illustrated) in addition to bit line 105 depending upon the binary state of a write multiplexer signal that drives a gate of a plurality of NMOS write multiplexer transistors within write multiplexer 125. For example, a write multiplexer transistor M2 couples between the drain of data transistor M5 and bit line 105. Similarly, write multiplexer 125 includes a write multiplexer transistor M3, a write multiplexer transistor M4, and write multiplexer transistor M7 that all couple between the drain of data transistor M5 and their respective bit lines (not illustrated). Write multiplexer 125 is thus a 4:1 multiplexer but it will be appreciated that other ratios of column multiplexing may be in alternative embodiments.

A memory controller 205 within negative bit line boost circuit 201 controls the write multiplexer transistors such as write multiplexer transistor M2 as discussed further herein. In particular, memory controller 205 controls the gate of write multiplexer transistor M2 with the write multiplexer signal. Each write multiplexer transistor thus has its own corresponding write multiplexer signal that may be asserted by memory controller 205.

As also discussed with regard to memory 100, a source of data transistor M5 couples to ground through a drain of NMOS write assist transistor M6. However, a logic circuit 210 drives the gate of write assist transistor M6 responsive to the write assist signal as discussed further herein. In memory 200, the write assist signal is active low such that it is asserted by being grounded. Logic circuit 210 responds to the falling edge of the write assist signal at the beginning of the write assist period to switch off write assist transistor M6. Since the write assist signal is active low, it will be charged high (e.g., to a power supply voltage VDD) while the write assist signal is de-asserted. Prior to the write assist period, write assist transistor M6 will thus be on such that if the data signal is in a binary high state, bit line 105 is discharged to ground. As also discussed with regard to memory 100, the default high state of the write assist signal passes through buffer 130 to charge a boost capacitor 135 formed by the gate capacitance of PMOS transistor P1. The gate of transistor P1 couples to the source of data transistor M5 whereas its drain and source are both coupled to the output of buffer 130. The drain and source of transistor P1 (the anode of boost capacitor 135) will thus be charged high by the buffer output signal as the gate of transistor P1 (the cathode of boost capacitor 135) is discharged to ground through the drain of write assist transistor M6 prior to the write assist period during a write operation in which the data signal is in a binary one state. When the write assist signal is asserted by being grounded to begin the write assist period, the cathode of boost capacitor 135 will thus be pulled below ground due to the gate capacitance for transistor P1. In particular, note that the anode boost capacitor 135 is positively charged with regard to the cathode of the boost capacitor prior to the write assist period. The gate capacitance of transistor P1 thus causes the source for data transistor M5 to be negatively charged. In turn, this negative charge passes through write multiplexer transistor M2 to negatively charge bit line 105 since memory controller 205 is configured to maintain the assertion of the write multiplexer signal during the write assist period. This negative boost for bit line 105 strengthens access transistor M1 compared to the PMOS transistor charging data node Q within inverter 115 so that the write operation speed is increased.

The falling edge of the write assist signal is delayed by buffer 130 so that write assist transistor M6 may first be turned off to cause bit line 105 to float so that bit line 105 may be subsequently pulled negative by boost capacitor 135 during the write assist period. In that regard, note that logic circuit 210 does not delay the falling edge of the write assist signal with regard to its application to the gate of write assist transistor M6. But logic circuit 210 does delay the rising edge of the write assist signal with regard to switching on write assist transistor M6 following the conclusion of the write assist period (the period of time during which the write assist signal is asserted). This delay by logic circuit 210 is quite advantageous because it maintains the isolation of bit line 105 from ground despite the write assist signal being de-asserted high (e.g., by being charged to the power supply voltage VDD) at the end of the write assist period. This de-assertion of the write assist signal causes the anode of boost capacitor 135 to be charged to the power supply voltage VDD, which in turn boosts the cathode voltage for boost capacitor 135 slightly above ground.

Controller 205 is configured to release (de-assert) the write multiplexer signal driving the gate of write multiplexer transistor M2 only at the conclusion of a boost charge recycling period following the conclusion of the write assist period. The positive charge at the source of data transistor M5 from the boost capacitor cathode may thus flow through data transistor M5 and through write multiplexer transistor M2 to charge bit line 105 slightly above ground during the boost charge recycling period.

There is thus no discharge to ground of charge from boost capacitor 135 at the conclusion of the write assist period. Instead, charge from boost capacitor 135 is effectively "recycled" to positively charge bit line 105 during the boost charge recycling period. The resulting positive charge of bit line 105 saves power because a pre-charge circuit (not illustrated) will pre-charge bit line 105 even higher in voltage during a pre-charge operation for a subsequent write operation. But the pre-charge circuit need not supply as much charge during such a pre-charge operation (as compared to charging bit line 105 from a grounded state) because bit line 105 is already slightly pre-charged due to the recycling of the boost capacitor charge.

At the conclusion of the boost charge recycling period, memory controller 205 releases the assertion of the write multiplexer signal so that write multiplexer transistor M2 switches off to isolate bit line 105 from data transistor M5. Logic circuit 210 is configured to pass the delayed rising edge of the write assist signal to the gate of write assist transistor M6 following the conclusion of the boost charge recycling period for negative bit line boost circuit 201 to again switch on write assist transistor M6 in anticipation of another write operation.

It will be appreciated that logic circuit 210 has a number of alternative embodiments depending upon whether the write assist signal is active-high or active-low. For example, a NOR gate may form logic circuit 210 for negative bit line boost circuit 201 shown in FIG. 2B in which negative bit line boost circuit 201 is configured to process an active-high write assist signal. NOR gate 210 receives the write assist signal and a delayed version of the write assist signal as produced by a delay circuit 215. Since the write assist signal is active-high, it is delayed through an odd number of inverters 220 to form a delayed inverted version of the write assist signal for driving the anode of boost capacitor 135. In this fashion, the delayed inverted version of the write assist signal will be grounded in response to the assertion of the write assist signal. Prior to the write assist period, both the delayed write assist signal and the write assist signal driving NOR gate 210 will be grounded to force the output of NOR gate 210 high to switch on write assist transistor M6. In response to the rising edge of the write assist signal, the output of NOR gate 210 will go low to switch off write assist transistor M6 during the write assist period. Note, however, that the delayed version of the write assist signal has no effect with regard to delaying the rising edge of the write assist signal to be processed through NOR gate 210 and switch off write assist transistor M6. In contrast, the de-assertion of the write assist signal at the end of the write assist period does not force NOR gate 210 to switch on write assist transistor M6 until the delayed version of the write assist signal is also de-asserted.

Referring again to FIG. 2A, it may thus be seen that logic circuit 210 functions to switch off write assist transistor M6 in response to the assertion of the write assist signal but to switch on the write assist transistor only in response to the expiration of a delay after the de-assertion of the write assist signal. The application of the delay is selective in that it triggered only at the de-assertion of the write assist signal and not triggered by the assertion of the write assist signal. To assure that memory controller 205 delays the de-assertion of the write multiplexer signal until the end of the boost charge recycling period, memory controller 205 may respond to the grounding of the anode of boost capacitor 135 as shown in FIG. 2B before beginning the boost charge recycling period. In particular, memory controller 205 may be configured to respond to a delayed version of the grounding of the boost capacitor anode to trigger the release of the write multiplexer signal. Referring again to delay circuit 215, it is configured such that the delay it imparts to the write assist signal is greater than the boost charge recycling period.

In one embodiment, logic circuit 210 and memory controller 205 may be deemed to form a means for controlling write multiplexer transistor M2 and write assist transistor M6 so that charge from boost capacitor 135 following a write assist period charges bit line 105 to a positive voltage.

Figure 3:
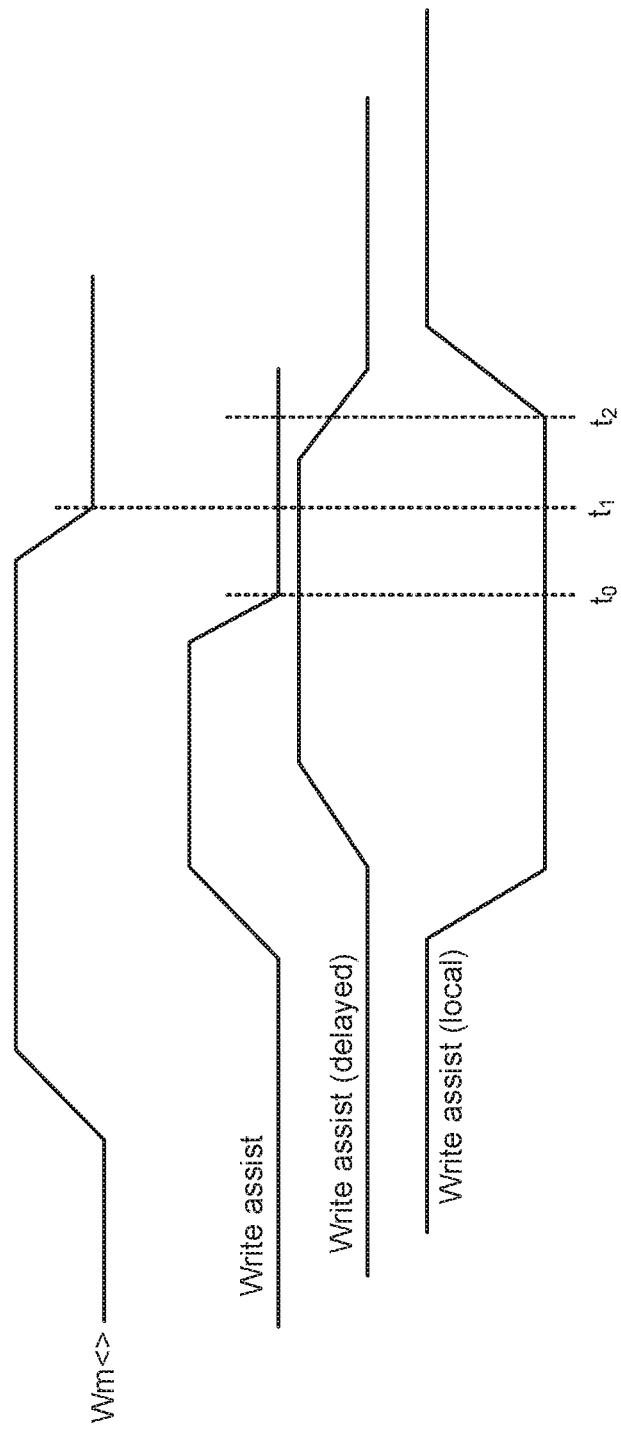
FIG. 3 is a timing diagram for some of the signals associated with the write assist period for the write assist circuit of FIG. 2B in accordance with an aspect of the disclosure.

An example timing diagram for the signals in negative bit line boost circuit 201 is shown in FIG. 3. The write multiplexer signal Wm<> is asserted prior to the assertion of the write assist signal as is conventional for negative bit line boost operation. At the conclusion of the write assist period, the write assist signal is de-asserted at a time t0. The output of NOR gate 210 is denoted as a write assist (local) signal, which does not go high at time t0 since a write assist (delayed) signal from delay circuit 215 is still high. At the expiration of the boost charge recycling period at time t1, the write multiplexer signal is released to isolate the slightly-positively-charged bit line 105. The write assist (delayed) signal is then released at a time t2 such that the write assist (local) signal may be driven high to again switch on write assist transistor M6.

Figure 4:
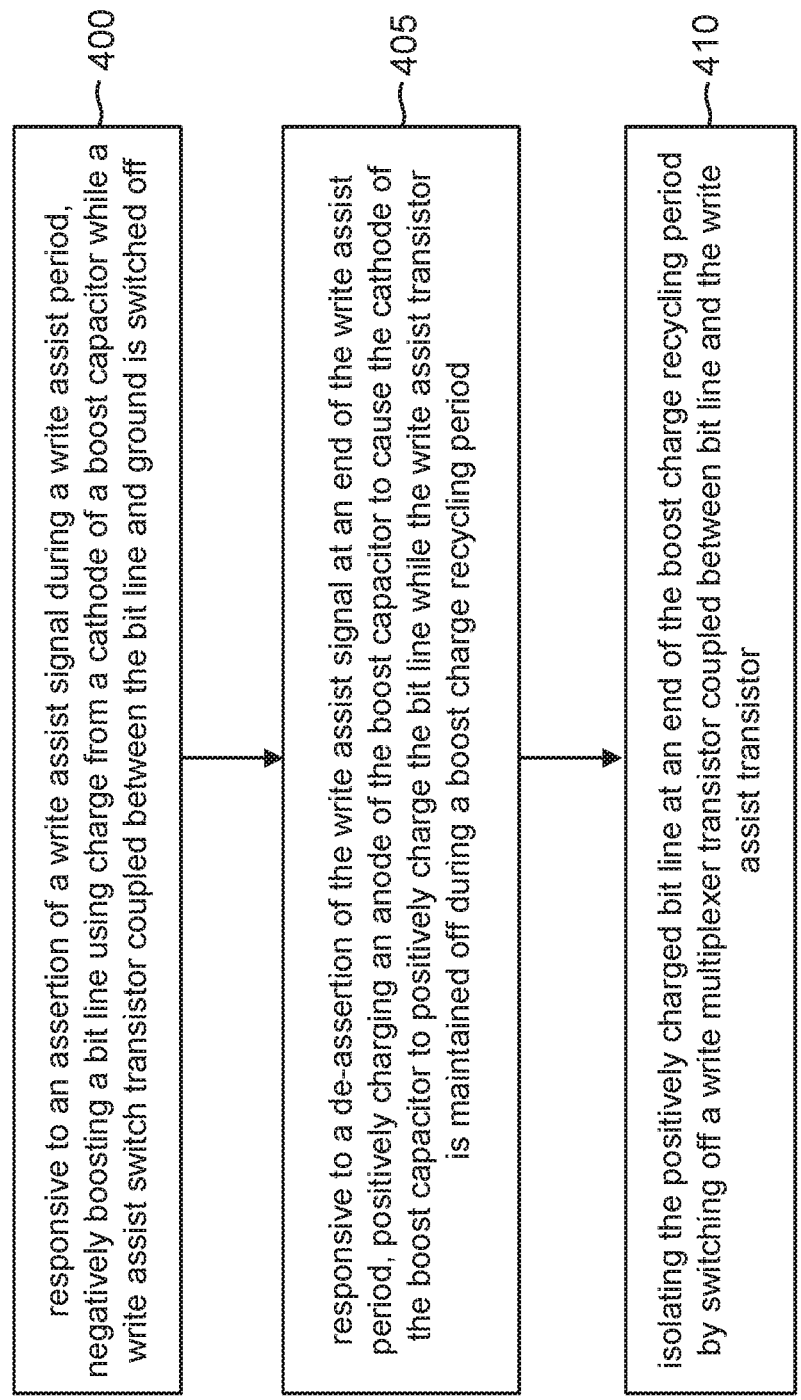
FIG. 4 is a flowchart for an example method of operation for a memory in which charge from the boost capacitor is utilized following the negative bit line boost to positively charge the bit line for reduced power consumption in accordance with an aspect of the disclosure.

An example method of operation for a negative bit line boost circuit as disclosed herein will now be discussed with reference to the flowchart of FIG. 4. The method includes an act 400 of, responsive to an assertion of a write assist signal during a write assist period, negatively boosting a bit line using charge from a cathode of a boost capacitor while a write assist switch transistor coupled between the bit line and ground is switched off. The negative boost of bit line 105 during the write assist period for memory 200 is an example of act 400. The method further includes an act 405 of, responsive to a de-assertion of the write assist signal at an end of the write assist period, positively charging an anode of the boost capacitor to cause the cathode of the boost capacitor to positively charge the bit line while the write assist transistor is maintained off during a boost charge recycling period. The recycling of the boost charge during the boost charge recycling period between times t0 and t1 as noted in FIG. 3 for negative bit line boost circuit 201 is an example of act 405. Finally, the method includes an act 410 of isolating the positively charged bit line at an end of the boost charge recycling period by switching off a write multiplexer transistor coupled between bit line and the write assist transistor. The switching of write multiplexer transistor M2 at the termination of the boost charge recycling period is an example of act 410.

As those of some skill in this art will by now appreciate and depending on the particular application at hand, many modifications, substitutions and variations can be made in and to the materials, apparatus, configurations and methods of use of the devices of the present disclosure without departing from the scope thereof. In light of this, the scope of the present disclosure should not be limited to that of the particular embodiments illustrated and described herein, as they are merely by way of some examples thereof, but rather, should be fully commensurate with that of the claims appended hereafter and their functional equivalents.

We claim:

1. A memory comprising:
    a bit line;
    a data transistor configured to switch on responsive to a data signal;
    a memory controller configured to assert a write multiplexer signal prior to an assertion of a write assist signal for a write assist period, wherein the memory controller is further configured to de-assert the write multiplexer signal at a conclusion of a boost charge recycling period following a termination of the write assist period;
    a write multiplexer transistor configured to couple a first terminal of the data transistor to the bit line responsive to the assertion of the write multiplexer signal and to isolate the data transistor from the bit line responsive to the de-assertion of the write multiplexer signal; and
    a boost capacitor having a cathode coupled to a second terminal of the data transistor, the boost capacitor being configured to negatively charge the bit line during the write assist period and to positively charge the bit line during the boost charge recycling period.

2. The memory of claim 1, further comprising:
    a write assist transistor coupled between the second terminal of the data transistor and ground.

3. The memory of claim 2, further comprising:
    a delay circuit configured to delay the write assist signal by a delay greater than the boost charge recycling period to form a delayed write assist signal; and
    a logic circuit configured to switch on the write assist transistor responsive to the assertion of the write assist signal and to switch off the write assist transistor responsive to a de-assertion of the delayed write assist signal.

4. The memory of claim 3, wherein the logic circuit comprises a NOR gate.

5. The memory of claim 1, further comprising: a delay circuit configured to delay the write assist signal into a delayed version of the write assist signal, wherein the delay circuit is configured to drive an anode of the boost capacitor with the delayed version of the write assist signal.

6. The memory of claim 1, further comprising:
    a word line:
    a memory cell including a pair of cross-coupled inverter; and
    an access transistor configured to couple the bit line to a data node for the memory cell responsive to an assertion of the word line.

7. The memory of claim 5, wherein the boost capacitor comprises a PMOS transistor.

8. The memory of claim 7, wherein the anode of the boost capacitor is a gate terminal for the PMOS transistor and both a drain terminal and a source terminal for the PMOS transistor are configured to form the cathode of the boost capacitor.

9. The memory of claim 1, wherein the data transistor is an NMOS data transistor.

10. The memory of claim 1, wherein the write multiplexer transistor is an NMOS write multiplexer transistor.

11. A write assist method comprising:
   responsive to an assertion of a write assist signal during a write assist period, negatively boosting a bit line using charge from a cathode of a boost capacitor while a write assist transistor coupled between the bit line and ground is switched off;
   responsive to a de-assertion of the write assist signal at an end of the write assist period, positively charging an anode of the boost capacitor to cause the cathode of the boost capacitor to positively charge the bit line while the write assist transistor is maintained off during a boost charge recycling period; and
   isolating the positively charged bit line at an end of the boost charge recycling period by switching off a write multiplexer transistor coupled between the bit line and the write assist transistor.

12. The write assist method of claim 11, further comprising:
   prior to the assertion of the write assist signal:
   switching on a data transistor responsive to an assertion of a data signal; and
   switching on the write multiplexer transistor to discharge the bit line to ground through the write multiplexer transistor, the data transistor, and the write assist transistor.

13. The write assist method of claim 12, further comprising:
   switching off the write assist transistor after the end of the boost charge recycling period.

14. The write assist method of claim 12, further comprising:
   while the bit line discharges to ground, charging the anode of the boost capacitor to a power supply voltage.

15. The write assist method of claim 12, wherein negatively boosting the bit line using charge from the cathode of the boost capacitor comprises grounding the anode of the boost capacitor responsive to the assertion of the write assist signal.

16. The write assist method of claim 11, further comprising:
   pre-charging the positively-charged bit line to a pre-charge voltage during a subsequent write operation.

17. The write assist method of claim 11, wherein positively charging the anode of the boost capacitor comprises positively charging a drain terminal and a source terminal of a PMOS transistor having a gate capacitor forming the boost capacitor.

* * * * *